(12) United States Patent
Jin et al.

(10) Patent No.: US 9,230,474 B2
(45) Date of Patent: Jan. 5, 2016

(54) ARRAY TESTING METHOD AND DEVICE

(75) Inventors: Guang hai Jin, Yongin (KR); Jae-Beom Choi, Yongin (KR); Kwan-Wook Jung, Yongin (KR); June-Woo Lee, Yongin (KR); Seong-Jun Kim, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 322 days.

(21) Appl. No.: 13/570,370

(22) Filed: Aug. 9, 2012

(65) Prior Publication Data
US 2013/0243304 A1    Sep. 19, 2013

(30) Foreign Application Priority Data
Mar. 14, 2012   (KR) .................. 10-2012-0026174

(51) Int. Cl.
| | | |
|---|---|---|
| G06K 9/00 | (2006.01) | |
| G09G 3/32 | (2006.01) | |
| G09G 3/00 | (2006.01) | |
| G01R 31/26 | (2014.01) | |

(52) U.S. Cl.
CPC .............. *G09G 3/3225* (2013.01); *G09G 3/006* (2013.01); *G01R 31/2635* (2013.01); *G06K 9/00* (2013.01)

(58) Field of Classification Search
CPC .............. G09G 2310/0283; G09G 2320/0214; G09G 3/006; G09G 3/3258; G09G 3/3233; G09G 2300/0439; G09G 3/2074; G09G 3/3266; G09G 2300/0443; G09G 3/3659; G09G 2300/0866; G09G 3/3241; G09G 3/325; G09G 2330/10; G09G 3/3291; G09G 2340/16; G09G 3/3655; G02F 1/136213; G02F 1/1368; G02F 2001/13613; H01L 27/1214; H01L 27/3211; H01L 27/3246; H01L 27/3213; G01R 31/2635; H04L 1/20; G06T 2207/30148; H04N 5/335
USPC ............ 382/149; 324/414; 345/76, 211, 212, 345/92, 77, 82, 107
See application file for complete search history.

(56) References Cited

U.S. PATENT DOCUMENTS

| | | | |
|---|---|---|---|
| 6,278,426 B1 * | 8/2001 | Akiyama | 345/87 |
| 6,469,289 B1 * | 10/2002 | Scott-Thomas et al. | 250/208.1 |
| 6,636,190 B2 * | 10/2003 | Hirakata et al. | 345/74.1 |
| 7,154,292 B2 * | 12/2006 | Chung | 324/760.02 |
| 7,317,326 B2 * | 1/2008 | Nakano et al. | 324/762.09 |
| 7,592,981 B2 * | 9/2009 | Maeda | 345/76 |
| RE41,237 E * | 4/2010 | Tanaka et al. | 345/204 |
| 8,248,329 B2 * | 8/2012 | Yamamoto et al. | 345/76 |
| 8,421,789 B2 * | 4/2013 | Ka | 345/211 |
| 8,599,186 B2 * | 12/2013 | Ogura | 345/211 |

(Continued)

FOREIGN PATENT DOCUMENTS

| | | |
|---|---|---|
| KR | 10-2001-0087833 A | 9/2001 |
| KR | 10-2008-0074560 A | 8/2008 |
| KR | 10-2011-0079030 A | 7/2011 |

*Primary Examiner* — Vu Le
*Assistant Examiner* — Aklilu Woldemariam
(74) *Attorney, Agent, or Firm* — Lee & Morse, P.C.

(57) ABSTRACT

A method for testing an array, by using an array testing device for detecting a voltage distribution formed on an array substrate, includes resetting pixel voltages of a plurality of pixel circuits formed on the array substrate with a predetermined voltage, detecting the voltage distribution of the array substrate, generating a correction value for correcting the voltage distribution of the array substrate, and measuring a threshold voltage of a driving transistor included in the plurality of pixel circuits formed on the array substrate by applying the correction value.

18 Claims, 7 Drawing Sheets

(56) References Cited

U.S. PATENT DOCUMENTS

| | | | |
|---|---|---|---|
| 8,901,936 B2* | 12/2014 | Jin et al. | 324/501 |
| 2002/0030647 A1* | 3/2002 | Hack et al. | 345/82 |
| 2002/0154084 A1* | 10/2002 | Tanaka et al. | 345/92 |
| 2003/0063081 A1* | 4/2003 | Kimura et al. | 345/211 |
| 2004/0150760 A1* | 8/2004 | Chung | 349/43 |
| 2004/0153183 A1* | 8/2004 | Chung | 700/97 |
| 2004/0174349 A1* | 9/2004 | Libsch et al. | 345/204 |
| 2004/0232940 A1* | 11/2004 | Chung | 324/770 |
| 2005/0007357 A1* | 1/2005 | Yamashita et al. | 345/204 |
| 2005/0024081 A1* | 2/2005 | Kuo et al. | 324/770 |
| 2005/0140637 A1* | 6/2005 | Yi | 345/98 |
| 2006/0027813 A1* | 2/2006 | Kim et al. | 257/72 |
| 2006/0028233 A1* | 2/2006 | Arazaki | 324/770 |
| 2006/0258061 A1* | 11/2006 | Jung et al. | 438/149 |
| 2007/0075727 A1* | 4/2007 | Nakano et al. | 324/770 |
| 2007/0216627 A1* | 9/2007 | Kim et al. | 345/92 |
| 2008/0111773 A1* | 5/2008 | Tsuge | 345/76 |
| 2008/0116928 A1* | 5/2008 | Kim et al. | 324/770 |
| 2008/0117144 A1* | 5/2008 | Nakano et al. | 345/76 |
| 2008/0129897 A1* | 6/2008 | Yasukawa | 349/5 |
| 2008/0284929 A1* | 11/2008 | Kimura | 349/38 |
| 2009/0251576 A1* | 10/2009 | Hattori et al. | 348/294 |
| 2009/0278835 A1* | 11/2009 | Ka | 345/211 |
| 2010/0039422 A1* | 2/2010 | Seto | 345/212 |
| 2010/0141626 A1* | 6/2010 | Tomida et al. | 345/211 |
| 2010/0177126 A1* | 7/2010 | Inoue et al. | 345/690 |
| 2011/0032243 A1* | 2/2011 | Tsuji | 345/212 |
| 2011/0122325 A1* | 5/2011 | Yamashita et al. | 348/739 |
| 2011/0157134 A1* | 6/2011 | Ogura | 345/211 |
| 2011/0221784 A1* | 9/2011 | Lee et al. | 345/690 |
| 2011/0221791 A1* | 9/2011 | Kajiyama et al. | 345/690 |
| 2012/0147070 A1* | 6/2012 | Segawa et al. | 345/694 |
| 2012/0161775 A1* | 6/2012 | Huang et al. | 324/414 |
| 2012/0280969 A1* | 11/2012 | Hough | 345/212 |

\* cited by examiner

ARRAY TESTING METHOD AND DEVICE

CROSS-REFERENCE TO RELATED APPLICATION

Korean Patent Application No. 10-2012-0026174 filed on Mar. 14, 2012, in the Korean Intellectual Property Office, and entitled: "Array Testing Method and Device," is incorporated herein by reference in its entirety.

BACKGROUND

Various processes may be performed to manufacture a final display panel. For example, a substrate cleaning process, an array substrate forming process, a substrate bonding process, and/or an array testing process may be performed. The array testing process may include checking for abnormalities.

SUMMARY

Embodiments may be realized by providing a method for testing an array by using an array testing device for detecting a voltage distribution formed on an array substrate that includes resetting pixel voltages of a plurality of pixel circuits formed on the array substrate with a predetermined voltage; detecting a voltage distribution of the array substrate; generating a correction value for correcting the voltage distribution of the array substrate; and measuring a threshold voltage of a driving transistor included in a plurality of pixel circuits formed on the array substrate by applying the correction value. 294746429

The resetting of pixel voltages of a plurality of pixel circuits formed on the array substrate with a predetermined voltage may include resetting a pixel voltage of a second electrode of the driving transistor with the first power source voltage connected to a first electrode of the driving transistor.

The resetting of pixel voltages of a plurality of pixel circuits formed on the array substrate with a predetermined voltage may include resetting the pixel voltage to be 0 V by applying the first power source voltage as 0 V.

The resetting of pixel voltages of a plurality of pixel circuits formed on the array substrate with a predetermined voltage may include generating a voltage at a gate electrode of the driving transistor as a first voltage; reducing a voltage at a second electrode of a capacitor having a first electrode connected to the gate electrode of the driving transistor, generating the first voltage to be a gate on voltage by coupling caused by the capacitor, and turning on the driving transistor; and resetting a pixel voltage of the second electrode of the driving transistor with a first power source voltage connected to the first electrode of the driving transistor.

The measuring of a threshold voltage of the driving transistor may include generating a voltage to which the threshold voltage of the driving transistor is applied into a pixel voltage by diode-connecting the driving transistor.

The measuring of a threshold voltage of the driving transistor may further include detecting a voltage distribution of the array substrate when the voltage to which the threshold voltage of the driving transistor is applied is generated as a pixel voltage.

Embodiments may also be realized by providing a device for testing an array that includes a light source for providing light to an array substrate; a modulator for modulating an optical characteristic of light having passed through the array substrate; a sensor for receiving the light modulated by the modulator and generating image information on the array substrate; and an image processor for detecting a voltage distribution formed on the array substrate surface by analyzing the image information, wherein the image processor corrects noise so that a voltage distribution that is measured in a first array test that is performed while pixel voltages of a plurality of pixel circuits included in the array substrate is reset may have a predetermined voltage.

The image processor may generate a correction value for correcting the voltage distribution measured in the first array test, and may apply the correction value to a second array test on the array substrate.

The second array test may be performed when the voltage to which a threshold voltage of the driving transistor included in the plurality of pixel circuits is applied is generated as the pixel voltage.

The noise may depend on non-uniformity of a distance between the modulator surface and the array substrate surface.

The device may further include a first polarizer for polarizing light output by the light source in a first polarization direction and irradiating it to the array substrate.

The device may further include a second polarizer for polarizing the light modulated by the modulator in a second polarization direction and irradiating it to the sensor.

Embodiments may also be realized by providing a method for testing an array by a display device including a plurality of pixels including a switching transistor for transmitting a data signal, a capacitor connected between the switching transistor and a driving transistor, and a compensation transistor connected between a gate electrode and a drain electrode of the driving transistor that includes resetting pixel voltages of the plurality of pixels with a predetermined voltage; detecting a voltage distribution of the pixels; generating a correction value for correcting the voltage distribution of the pixels; and measuring threshold voltages of the driving transistors of the pixels by applying the correction value.

The resetting of pixel voltages of the plurality of pixels with a predetermined voltage may include supplying the data signal of a first level to a first electrode of the first capacitor while the switching transistor is turned on; turning on the compensation transistor, and controlling a power source voltage connected to a source electrode of the driving transistor to have a second level; turning off the compensation transistor; supplying a data signal of a second level to a first electrode of the first capacitor; and turning on the driving transistor, and resetting the pixel voltage with the power source voltage.

The resetting of pixel voltages of the plurality of pixels with a predetermined voltage may include turning on the switching transistor and supplying a data signal of a first level to a first electrode of the first capacitor while a power source voltage connected to a source electrode of the driving transistor is maintained at the first level; turning on the compensation transistor; and resetting the pixel voltage and a gate electrode of the driving transistor with the power source voltage.

The measuring of a threshold voltage of the driving transistor may include turning on the compensation transistor, controlling the power source voltage to have a first level, and generating a voltage to which a threshold voltage of the driving transistor is applied as a pixel voltage.

The measuring of a threshold voltage of the driving transistor may further include detecting a voltage distribution of the plurality of pixels while the voltage to which the threshold voltage of the driving transistor is generated to be the pixel voltage.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
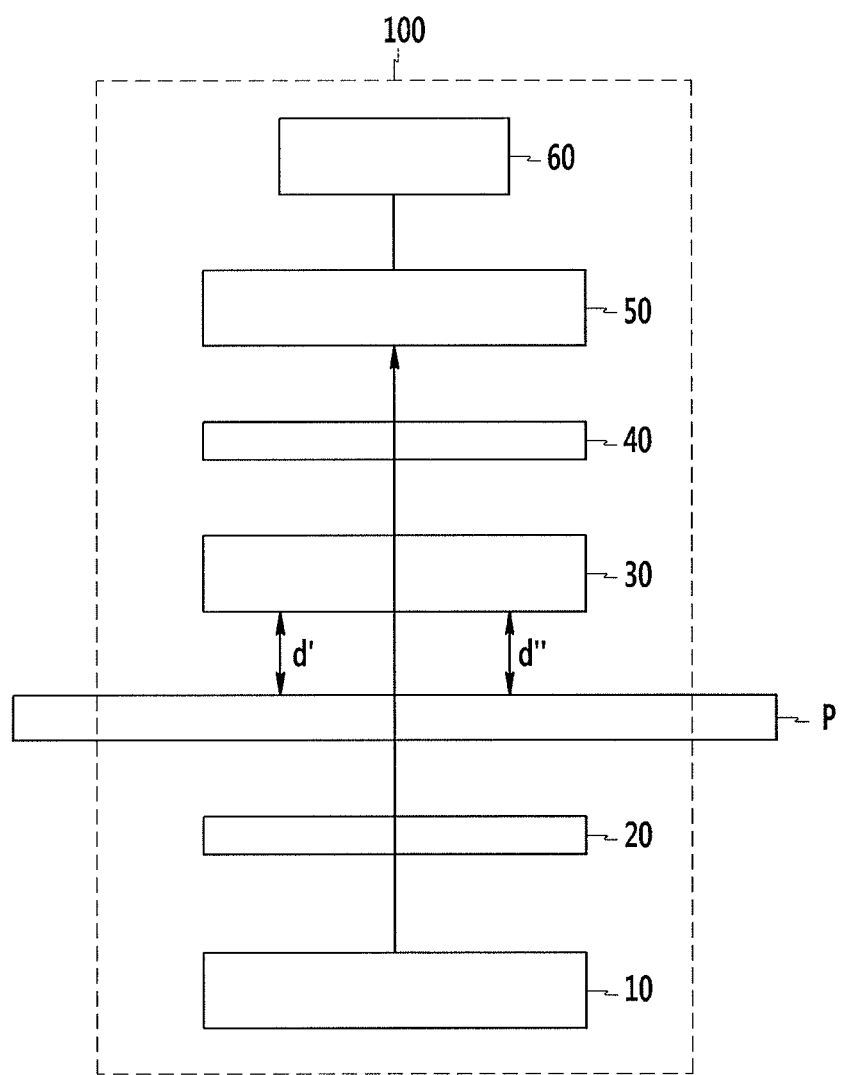
FIG. 1 illustrates a block diagram of an array testing device according to an exemplary embodiment.

Embodiments will be described more fully hereinafter with reference to the accompanying drawings, in which exemplary embodiments are shown. As those skilled in the art would realize, the described embodiments may be modified in various different ways, all without departing from the spirit or scope of the invention.

In various exemplary embodiments, the same reference numerals are used for elements having the same configurations and will be representatively described in a first exemplary embodiment, and in other exemplary embodiments, only elements different from those of the first exemplary embodiment will be described.

Parts that are irrelevant to the description are omitted in order to clearly describe the exemplary embodiments. Like reference numerals designate like elements throughout the specification.

Throughout this specification and the claims that follow, when it is described that an element is "coupled" to another element, the element may be "directly coupled" to the other element or may be "electrically coupled" to the other element through a third element. Unless explicitly described to the contrary, the word "comprise" and variations such as "comprises" or "comprising" will be understood to imply the inclusion of stated elements but not the exclusion of any other elements.

FIG. 1 shows a block diagram of an array testing device 100 according to an exemplary embodiment.

Referring to FIG. 1, the array testing device 100 may include a light source 10, a first polarizer 20, a modulator 30, a second polarizer 40, a sensor 50, and an image processor 60.

The light source 10 provides light to an array substrate (P).

The first polarizer 20 polarizes the light output by the light source 10 in a first polarization direction. The light polarized by the first polarizer 20 may be irradiated to the array substrate (P), and then may be transmitted to the array substrate (P) in proportion to a voltage distribution on the surface of the array substrate (P).

The modulator 30 modulates an optical characteristic of the light having passed through the array substrate (P). A reference voltage may be applied to a conductive layer of the modulator 30, and an electric field may be formed between the conductive layer of the modulator 30 and the array substrate (P) surface.

The second polarizer 40 polarizes the light modulated by the modulator 30 in a second polarization direction that is different from the first polarization direction. The second polarization direction may intersect, e.g., may be perpendicular to, the first polarization direction. The light polarized by the second polarizer 40 may be irradiated to the sensor 50.

The sensor 50 receives the light polarized by the second polarizer 40 to generate image information on the array substrate (P) and transmits the same to the image processor 60. A CCD camera may be adopted for the sensor 50.

The image processor 60 analyzes the image information according to an image processing method to detect the voltage distribution formed on the array substrate (P) surface. The image processor 60 may find a thin film pattern part that is not normally formed, i.e., that has an abnormality and/or a defect, on the array substrate (P) from the voltage distribution that is formed on the array substrate (P) surface.

The array testing device 100 may test the array substrate (P) while the modulator 30 is separated from the array substrate (P) by a predetermined distance. In some instances, the distance between the modulator 30 surface and the array substrate (P) surface may not be uniform. That is, the modulator 30 surface may not be arranged to be perfectly parallel with the array substrate (P) surface. For example, the distance between the modulator 30 surface and the array substrate (P) surface may be d' at one part at one region and the distance may be d" at another region (d'≠d").

When the distance between the modulator 30 surface and the array substrate (P) surface is not uniform, the electric field between the conductive layer of the modulator 30 and the array substrate (P) surface may not be accurately formed, and the light irradiated to the sensor 50 through the second polarizer 40 may include noise caused by non-uniformity of the distance between the modulator 30 surface and the array substrate (P) surface. Resultantly, the sensor 50 may generate image information including noise caused by non-uniformity between the modulator 30 surface and the array substrate (P) surface, and an error may be generated when the image processor 60 processes the voltage distribution.

In order to remove and/or reduce the possibility of the above-noted noise, the array testing device 100 tests the first array when a pixel voltage of the array substrate (P) is reset. The array testing device 100 may use image information that is generated by testing the first array to compensate the noise. The array testing device 100 tests the second array to check whether the thin film pattern is normally formed on the array substrate (P).

A method for improving precision of the array testing device 100 by removing the above-noted noise will now be described.

Figure 2:
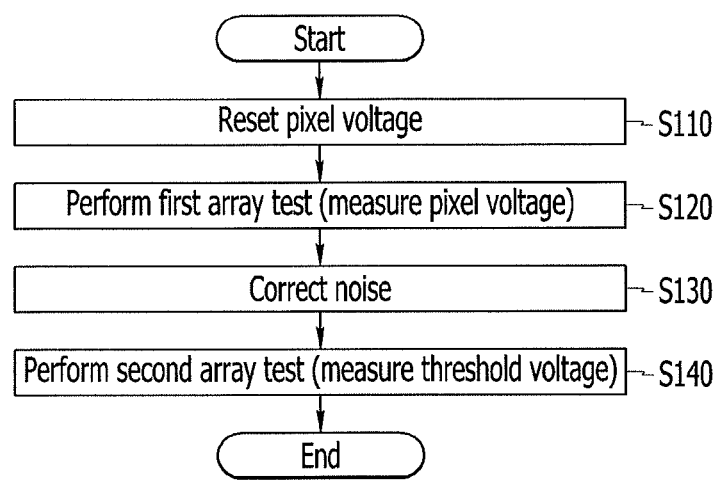
FIG. 2 illustrates a flowchart of an array testing method according to an exemplary embodiment.

FIG. 2 shows a flowchart of an array testing method according to an exemplary embodiment.

Referring to FIG. 2, in the array testing process, an array substrate for the organic light emitting diode (OLED) display has a pixel circuit that is formed before it is combined with the organic light emitting diode (OLED). A part that is combined with the organic light emitting diode (OLED) on the array substrate on which the pixel circuit is formed floats. That is, the pixel voltage at the pixel circuit represents a floating voltage.

The pixel voltages at a plurality of pixel circuits formed on the array substrate are reset with a constant voltage (S110). That is, the pixel voltage, a floating voltage, is reset to be a constant voltage. A method for resetting the pixel voltage is determined by a pixel circuit configuration.

Figure 3A:
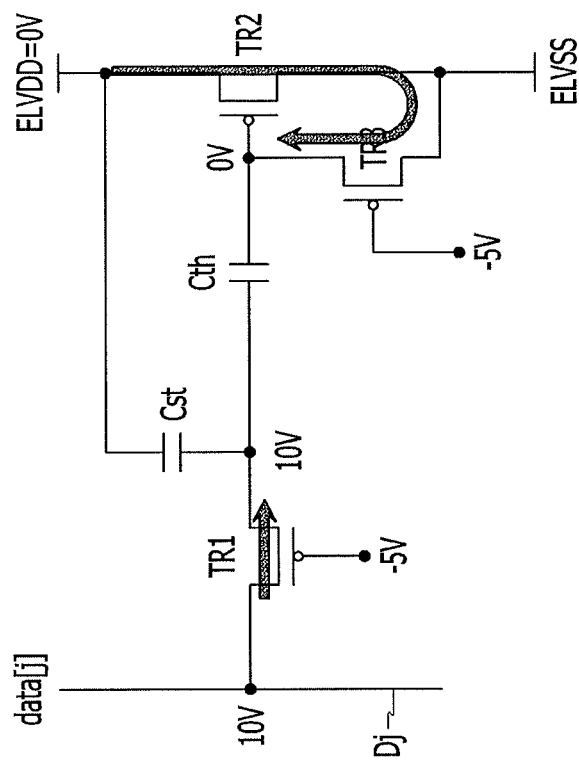
FIGS. 3A, 3B, and 3C illustrate processes for resetting a pixel voltage according to an exemplary embodiment.
Figure 3B:
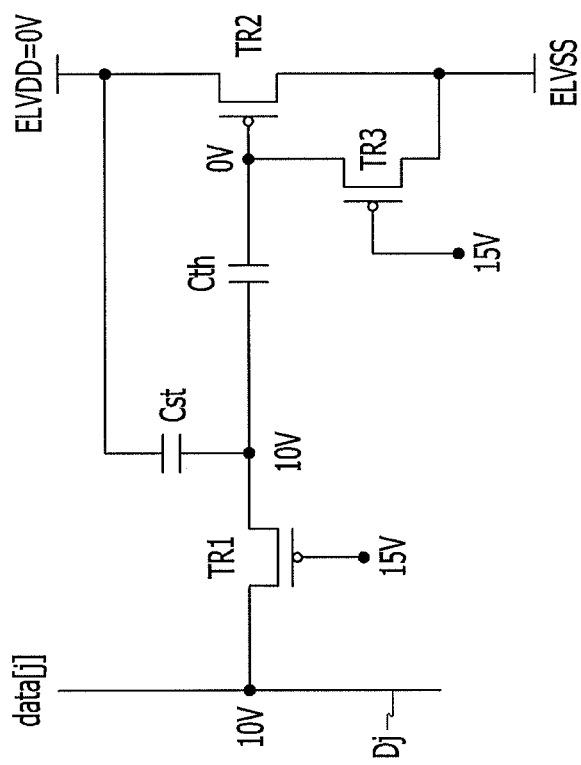
Figure 3C:
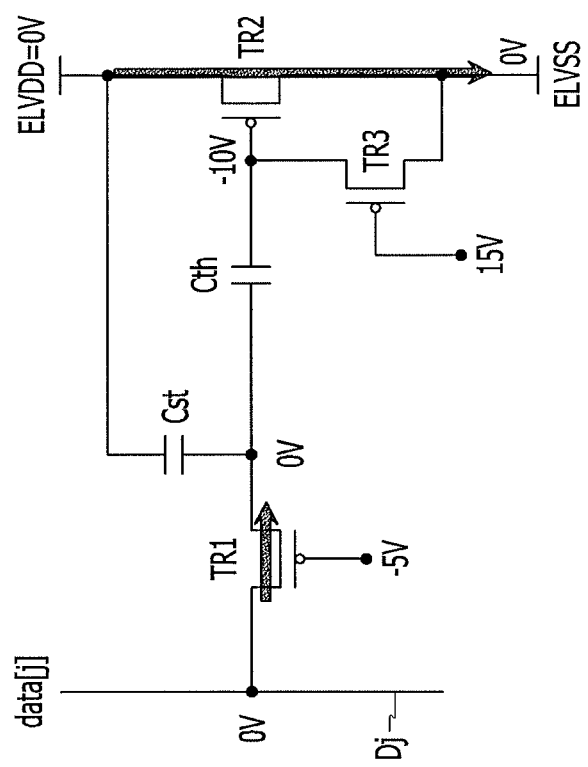

Here, it will be assumed that a pixel circuit shown in FIG. 3A to 3C has already been formed on the array substrate.

The method for resetting the pixel voltage will now be described with reference to FIG. 3A to 3C.

FIG. 3A to 3C show a process for resetting a pixel voltage according to an exemplary embodiment.

A configuration of a pixel circuit for an organic light emitting diode (OLED) display will now be described.

The pixel circuit may include a switching transistor TR1, a driving transistor TR2, a compensation transistor TR3, a compensation capacitor Cth, and a storage capacitor Cst.

The switching transistor TR1 includes a gate electrode connected to a scan line, a first electrode connected to a data line (Dj), and a second electrode connected to a first electrode of the compensation capacitor Cth. The switching transistor TR1 transmits a voltage at the data line (Dj) to the first electrode of the compensation capacitor Cth.

The driving transistor TR2 includes a gate electrode connected to a second electrode of the compensation capacitor (Cth), a first electrode connected to a first power source voltage (ELVDD), and a second electrode connected to a second power source voltage (ELVSS). The second power source voltage (ELVSS) represents a part combined with the organic light emitting diode (OLED) after the array testing process, and it becomes the pixel voltage.

The compensation transistor TR3 includes a gate electrode connected to a compensation control line, a first electrode connected to a gate electrode of the driving transistor TR2 (e.g., connected to the second electrode of the compensation capacitor (Cth)), and a second electrode connected to the second power source voltage (ELVSS).

The compensation capacitor (Cth) includes a first electrode connected to the second electrode of the switching transistor TR1 and a second electrode connected to the gate electrode of the driving transistor TR2.

The storage capacitor Cst includes a first electrode connected to the second electrode of the switching transistor TR1 and a second electrode connected to the first power source voltage (ELVDD).

The switching transistor TR1, the driving transistor TR2, and the compensation transistor TR3 may be, e.g., p-channel field effect transistors. In this instance, a gate on voltage for turning on the switching transistor TR1, the driving transistor TR2, and the compensation transistor TR3 may represent a logic low level voltage (referred to as a low voltage hereinafter), and a gate off voltage for turning them off may represent a logic high level voltage (referred to as a high voltage hereinafter).

At least one of the p-channel field effect transistors, e.g., of the switching transistor TR1, the driving transistor TR2, and/or the compensation transistor TR3, may be modified to be an n-channel field effect transistor. In this instance, the gate on voltage for turning on the n-channel field effect transistor may be the high voltage and the gate off voltage for turning it off may be the low voltage.

Referring to FIG. 3A, the gate on voltage (e.g., of about −5 V) may be applied to the gate electrode of the switching transistor TR1 to turn on the switching transistor TR1, and about 10 V may be applied as the voltage of the data line (Dj). Accordingly, the voltage at the first electrode of the compensation capacitor (Cth) may become about 10 V.

The gate on voltage (e.g., about −5 V) may be applied to the gate electrode of the compensation transistor TR3 to turn on the compensation transistor TR3, and the gate electrode and drain electrode of the driving transistor TR2 may be connected so that the driving transistor TR2 functions as a diode.

In this instance, the first power source voltage (ELVDD) may become about 0 V, and the first power source voltage (ELVDD) may be transmitted to the gate electrode of the driving transistor TR2 through the driving transistor TR2 and the compensation transistor TR3. Therefore, the voltage at the gate electrode of the driving transistor TR2 becomes about 0 V.

Referring to FIG. 3B, the voltage at the first electrode of the compensation capacitor (Cth) is set to be about 10 V, the voltage at the gate electrode of the driving transistor TR2 is set to be about 0 V, and the gate off voltage of about 15 V is applied to the gate electrode of the switching transistor TR1 and the gate electrode of the compensation transistor TR3 to turn off the switching transistor TR1 and the compensation transistor TR3. In this instance, the first power source voltage (ELVDD) is maintained at about 0 V.

The voltage at the gate electrode of the driving transistor TR2 is about 0 V (i.e., it floats).

Referring to FIG. 3C, while the voltage at the gate electrode of the driving transistor TR2 is about 0 V, the data line (Dj) is set to about 0 V and the gate on voltage (e.g., about −5 V) is applied to the gate electrode of the switching transistor TR1. In this instance, the first power source voltage (ELVDD) is maintained at about 0 V.

The about 0 V at the data line (Dj) is transmitted to the first electrode of the compensation capacitor (Cth) so that the voltage at the first electrode of the compensation capacitor (Cth) is reduced to about 0 V from about 10 V. The voltage at the gate electrode of the driving transistor TR2 is reduce to about −10 V from about 0 V by coupling caused by the compensation capacitor (Cth).

When the voltage at the gate electrode of the driving transistor TR2 is reduced to about −10 V, the driving transistor TR2 may be turned on and the first power source voltage (ELVDD) may be transmitted to the second power source voltage (ELVSS) to reset the second power source voltage (ELVSS) as about 0 V. That is, the pixel voltage is reset to be about 0 V by the first power source voltage (ELVDD).

Another method for resetting the pixel voltage will now be described with reference to FIG. 4. The pixel circuit shown in FIG. 4 is substantially equivalent to the pixel circuit shown in FIG. 3A to 3C.

Figure 4:
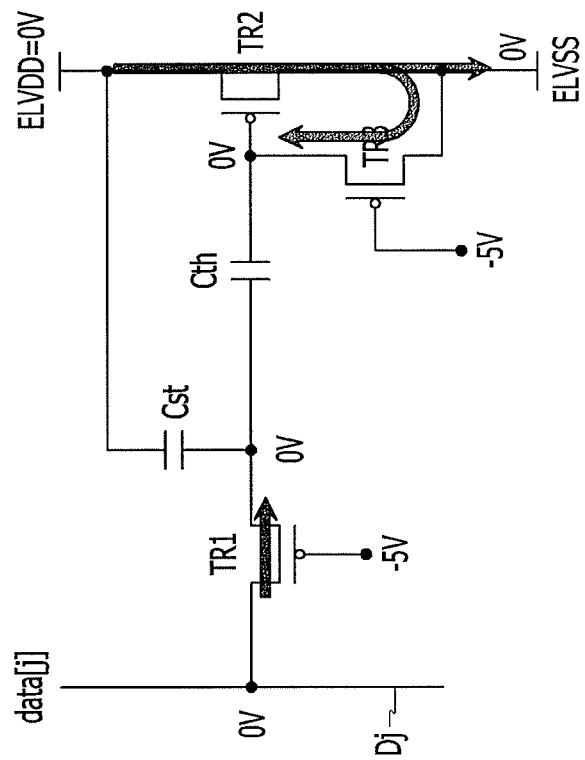
FIG. 4 illustrates a process for resetting a pixel voltage according to an exemplary embodiment.

FIG. 4 shows a process for resetting a pixel voltage according to another exemplary embodiment.

Referring to FIG. 4, the gate on voltage (e.g., about −5 V) is applied to the gate electrode of the switching transistor TR1 to turn on the switching transistor TR1 and the data line (Dj) is set at about 0 V. In this instance, the first power source voltage (ELVDD) is maintained at about 0 V.

The voltage at the first electrode of the compensation capacitor (Cth) becomes about 0 V. A predetermined amount of charges may be charged in the compensation capacitor (Cth). When the voltage at the first electrode of the compensation capacitor (Cth) is changed to about 0 V, the voltage at the second electrode of the compensation capacitor (Cth) is also changed. That is, the gate voltage of the driving transistor TR2 is changed.

When the gate voltage of the driving transistor TR2 is changed while the first power source voltage (ELVDD) of about 0 V is applied to the first electrode of the driving transistor TR2, a gate-source voltage difference of the driving transistor TR2 is generated and the driving transistor TR2 is turned on.

The gate on voltage (e.g., about −5 V) is applied to the gate electrode of the compensation transistor TR3 to turn on the compensation transistor TR3. When the above-noted state is maintained for a predetermined time, the gate electrode of the driving transistor TR2 and the second power source voltage (ELVSS) are reset to be about 0 V by the first power source voltage (ELVDD).

Referring to FIG. 2, the entire pixel voltages of the array substrate (P) may be reset to about 0 V and the array testing device 100 may be used to measure the pixel voltage of the array substrate (P), thereby performing the first array test (S120). That is, the array testing device 100 is used to measure the voltage distribution of the array substrate (P).

The entire pixel voltages of the array substrate (P) may be reset with the same voltage of about 0 V so the voltage distribution of the array substrate (P) detected by the image processor 60 may be and/or must be constant.

However, when the distance between the surface of the modulator 30 and the surface of the array substrate (P) is not uniform, the voltage distribution of the array substrate (P) may become non-uniform, which is caused because the noise according to non-uniformity of the distance between the surface of the modulator 30 and the surface of the array substrate (P) is reflected.

The image processor 60 may correct noise so that the voltage distribution of the array substrate (P) may be constant while the entire pixel voltages of the array substrate (P) are reset (S130). The image processor 60 may generate a correction value for correcting the voltage distribution of the array substrate (P) with a constant value. The generated correction value may be applied to the case in which the second array test for the array substrate (P) is performed.

A voltage to which a threshold voltage of the driving transistor TR2 for each pixel may be generated for the array substrate (P), and the second array test for measuring the threshold voltage of each pixel of the array substrate (P) may be performed (S140).

Figure 5:
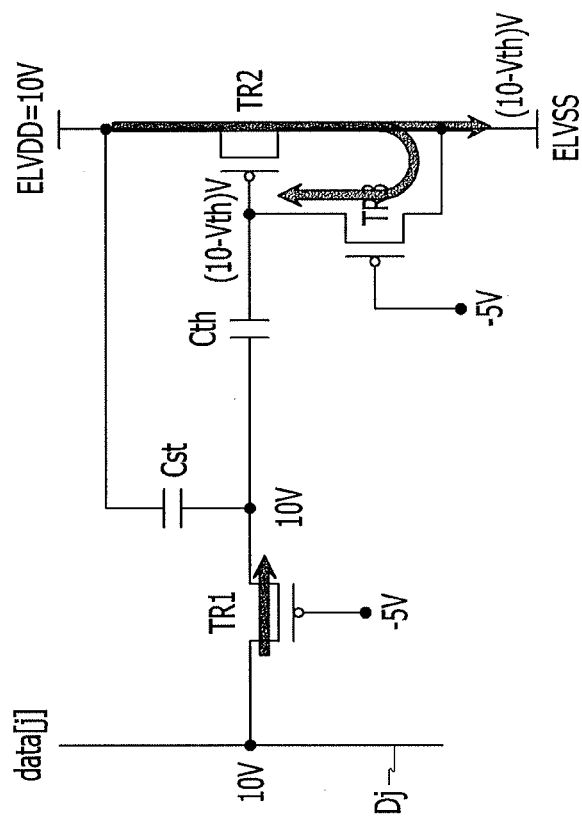
FIG. 5 illustrates a process for measuring a threshold voltage according to an exemplary embodiment.

Referring to FIG. 5, a method for measuring the threshold voltage of each pixel of the array substrate (P) will now be described. FIG. 5 shows a process for measuring a threshold voltage according to an exemplary embodiment.

Referring to FIG. 5, the gate on voltage (e.g., about −5 V) is applied to the gate electrode of the switching transistor TR1 to turn on the switching transistor TR1, and about 10 V is applied to the data line (Dj). The gate on voltage (e.g., about −5 V) is applied to the gate electrode of the compensation transistor TR3 to turn on the compensation transistor TR3. Here, the first power source voltage (ELVDD) becomes about 10 V.

When the compensation transistor TR3 is turned on and the first power source voltage (ELVDD) is applied as about 10 V, the driving transistor TR2 may be diode-connected. Accordingly, the voltage (10 V-Vth) generated by subtracting the threshold voltage (Vth) of the driving transistor TR2 from the first power source voltage (ELVDD) may be supplied to the gate electrode of the driving transistor TR2. The voltage (10 V-Vth) generated by subtracting the threshold voltage (Vth) of the driving transistor TR2 from the first power source voltage (ELVDD) may be supplied to the second power source voltage (ELVSS).

As described above, the voltage, according to the threshold voltage (Vth) of the driving transistor TR2 of each pixel circuit of the array substrate (P), is generated as the pixel voltage. In this state, the threshold voltage of each pixel of the array substrate (P) may be measured by detecting the voltage distribution of the array substrate (P) by use of the array testing device 100. For example, the image processor 60 may detect the voltage distribution of the array substrate (P) by applying the correction value for correcting noise.

Therefore, the threshold voltage of the driving transistor TR2 of each pixel of the array substrate (P) measured through the second array testing process may be detected as the value from which the noise caused by the distance non-uniformity between the surface of the modulator 30 and the surface of the array substrate (P).

By way of summation and review, an array testing process may check whether thin-film patterns are normally formed on an array substrate, e.g., check to see if there are abnormalities and/or defects in the thin-film patterns. An optical testing device may be used to test the array of patterns on the array substrate. The optical testing device may represent a device for measuring a voltage distribution of a surface of the array substrate by using a modulator for modulating an optical characteristic following a voltage distribution on the array substrate surface.

When the array substrate is tested by using the optical testing device, the array substrate may be arranged at a distance from the modulator, e.g., spaced apart by a predetermined gap therebetween. In this instance, the gap between the array substrate and the modulator may be non-uniform. When the voltage distribution of the array substrate surface is measured, noise may be included because of non-uniformity of the gap between the array substrate and the modulator. The noise may work as a factor to deteriorate precision of the optical testing device. For example, the testing of the array of the display panel may not be accurately performed because of the noise.

In contrast, embodiments relate to an array testing method and an array testing device for reducing and/or removing noise that may occur during an array test and for performing an accurate array test. In other words, embodiments relate to providing the array testing method and the array testing device for performing an accurate array test by reducing and/or removing noise that may occur during the array test.

Further, fine mura may be detected by reducing and/or removing the noise that may occur during the array test, and precision of the array test may be improved. In other words, according to the embodiments, the fine mura may be detected by reducing and/or removing noise that occurs during the array test so that precision of the array test may be improved.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A method for testing an array substrate by using an array testing device for measuring a voltage distribution formed on the array substrate based on an optical characteristic caused by the voltage distribution, the method comprising:
    resetting pixel voltages of a plurality of pixel circuits formed on the array substrate with a predetermined voltage such that the pixel voltages of the plurality of pixel circuits have a same voltage, and the array substrate has uniform voltage distribution;
    measuring the uniform voltage distribution of the array substrate by the array testing device to generate a measured voltage distribution of the array substrate;
    generating a correction value for calibrating the array testing device based on the uniform voltage distribution and the measured voltage distribution of the array substrate; and
    measuring a threshold voltage of a driving transistor included in each of the plurality of pixel circuits formed on the array substrate by applying the correction value.

2. The method as claimed in claim 1, wherein resetting of the pixel voltages of the plurality of pixel circuits formed on the array substrate with the predetermined voltage includes resetting a pixel voltage of a second electrode of the driving transistor with a first power source voltage connected to a first electrode of the driving transistor.

3. The method as claimed in claim 2, wherein resetting of the pixel voltages of the plurality of pixel circuits formed on the array substrate with the predetermined voltage includes resetting the pixel voltages to be about 0 V by setting the first power source voltage as about 0 V.

4. The method as claimed in claim 1, wherein resetting of the pixel voltages of the plurality of pixel circuits formed on the array substrate with the predetermined voltage includes:
generating a voltage at a gate electrode of the driving transistor as a first voltage;
reducing a voltage at a second electrode of a capacitor having a first electrode connected to the gate electrode of the driving transistor, generating the first voltage to be a gate on voltage by coupling caused by the capacitor, and turning on the driving transistor; and
resetting a pixel voltage of a second electrode of the driving transistor with a first power source voltage connected to a first electrode of the driving transistor.

5. The method as claimed in claim 1, wherein measuring of the threshold voltage of the driving transistor includes generating a voltage to which the threshold voltage of the driving transistor is applied as another pixel voltage by diode-connecting the driving transistor.

6. The method as claimed in claim 5, wherein measuring of the threshold voltage of the driving transistor further includes detecting another voltage distribution of the array substrate when the voltage to which the threshold voltage of the driving transistor is applied is generated as the other pixel voltage.

7. A testing device for testing an array substrate, wherein the testing device for measuring a voltage distribution formed on the array substrate based on an optical characteristic caused by the voltage distribution, the device comprising:
a light source that provides light to the array substrate, the array substrate having a uniform voltage distribution generated by resetting pixel voltages of a plurality of pixel circuits included in the array substrate with a predetermined voltage such that the pixel voltages of the plurality of pixel circuits have a same voltage, in a first array test;
a modulator that modulates an optical characteristic of light having passed through the array substrate;
a sensor that receives light modulated by the modulator and generating image information on the array substrate; and
an image processor that measures the uniform voltage distribution formed on a surface of the array substrate by analyzing the image information including an optical characteristic caused by the uniformed voltage distribution to generate a measured voltage distribution of the array substrate, wherein:
the image processor is to generate a correction value for calibrating the array testing device and to correct noise of the measured voltage distribution based on the uniform voltage distribution and the measured voltage distribution of the array substrate in the first array test, and
the testing device performs a second array test after the first array test to measure a threshold voltage of a driving transistor included in each of the plurality of pixel circuits on the array substrate by applying the correction value.

8. The device as claimed in claim 7, wherein the second array test is performed when a voltage to which the threshold voltage of the driving transistor included in the plurality of pixel circuits is applied is generated as another pixel voltage.

9. The device as claimed in claim 7, wherein the noise depends on non-uniformity of a distance between a surface of the modulator and the surface of the array substrate.

10. The device as claimed in claim 7, further comprising a first polarizer that polarizes light output by the light source in a first polarization direction and irradiates first polarized light to the array substrate.

11. The device as claimed in claim 10, further including a second polarizer that polarizes the light modulated by the modulator in a second polarization direction and irradiates second polarized light it to the sensor.

12. A method for testing an array substrate of a display device by using an array testing device for measuring a voltage distribution formed on the array substrate based on an optical characteristic caused by the voltage distribution, the array substrate including a plurality of pixels each having a switching transistor for transmitting a data signal, a capacitor connected between the switching transistor and a driving transistor, and a compensation transistor connected between a gate electrode and a drain electrode of the driving transistor, the method comprising:
resetting pixel voltages of the plurality of pixels with a predetermined voltage such that the pixel voltages of the plurality of pixels have a same voltage, and the array substrate has a uniform voltage distribution;
measuring the uniform voltage distribution of the pixels by the array testing device to generate a measured voltage distribution of the pixels;
generating a correction value for calibrating the array testing device based on the uniform voltage distribution and the measured voltage distribution of the pixels; and
measuring threshold voltages of the driving transistors of the plurality of pixels by applying the correction value.

13. The method as claimed in claim 12, wherein resetting of the pixel voltages of each of the plurality of pixels with the predetermined voltage includes:
supplying a data signal of a first level to a first electrode of the capacitor while the switching transistor is turned on;
turning on the compensation transistor, and controlling a power source voltage connected to a source electrode of the driving transistor to have a second level;
turning off the compensation transistor;
supplying a data signal of a second level to the first electrode of the capacitor; and
turning on the driving transistor, and resetting the pixel voltages with the power source voltage.

14. The method as claimed in claim 12, wherein resetting of the pixel voltages of each of the plurality of pixels with the predetermined voltage includes:
turning on the switching transistor and supplying a data signal of a first level to a first electrode of the capacitor while a power source voltage connected to a source electrode of the driving transistor is maintained at the first level;
turning on the compensation transistor; and
resetting the pixel voltages and the gate electrode of the driving transistor with the power source voltage.

15. The method as claimed in claim 12, wherein measuring of each of the threshold voltages of the driving transistors includes turning on the compensation transistor, controlling a power source voltage to have a first level, and generating voltages to which the threshold voltages of each of the driving transistors are applied as other pixel voltages.

16. The method as claimed in claim 15, wherein measuring of each of the threshold voltages of the driving transistors further includes detecting another voltage distribution of the plurality of pixels while the voltages to which the threshold voltages of each of the driving transistors are applied are generated to be the other pixel voltages.

17. The method as claimed in claim 1, wherein resetting of pixel voltages of the plurality of pixel circuits formed on the array substrate with the predetermined voltage includes charging a portion of each of the pixel circuits to be connected to a light emitting diode with the predetermined voltage, and the portion of each of the pixel circuits is electrically floated.

18. The method as claimed in claim 1, wherein the correction value is for correcting the measured voltage distribution of the array substrate to be substantially same with the uniform voltage distribution of the array substrate.

* * * * *